US008837158B2

(12) United States Patent
Lu

(10) Patent No.: US 8,837,158 B2
(45) Date of Patent: Sep. 16, 2014

(54) ELECTRONIC DEVICE WITH BLOCKING MECHANISM

(75) Inventor: Wen-Hu Lu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 46 days.

(21) Appl. No.: 13/606,090

(22) Filed: Sep. 7, 2012

(65) Prior Publication Data

US 2014/0029214 A1    Jan. 30, 2014

(30) Foreign Application Priority Data

Jul. 27, 2012    (CN) ........................ 2012 1 02629220

(51) Int. Cl.
*H05K 5/00*    (2006.01)

(52) U.S. Cl.
USPC ........ 361/759; 361/752; 361/740; 174/138 E; 174/138 G

(58) Field of Classification Search
CPC ..... H05K 7/14; H05K 7/1402; H05K 7/1403; H05K 7/1404; H05K 7/1405; H05K 7/1406; H05K 7/1407; H05K 7/1408; H05K 7/1409; H05K 7/1417; H05K 7/1418; H05K 5/00; H05K 5/006; H05K 5/0221; G06F 1/183; G06F 1/184; G06F 1/185; G06F 1/186; G06F 1/1679; G11B 33/123; G11B 33/128

USPC ......... 361/801, 802, 804, 807, 809, 810, 825, 361/679.31, 679.57, 679.58, 725–727, 732, 361/740, 741, 752, 754, 756, 759; 174/138 E, 138 G
See application file for complete search history.

(56) References Cited

U.S. PATENT DOCUMENTS

| | | | |
|---|---|---|---|
| 6,752,276 B2 * | 6/2004 | Rumney ...................... 211/41.17 |
| 7,027,306 B2 * | 4/2006 | Chen et al. ..................... 361/725 |
| 7,414,861 B2 * | 8/2008 | Tsai .............................. 361/810 |
| 7,516,441 B2 * | 4/2009 | Hamilton et al. ............. 717/110 |
| 8,456,853 B2 * | 6/2013 | Lin et al. ....................... 361/759 |
| 2005/0128723 A1 * | 6/2005 | Chen et al. ..................... 361/801 |

* cited by examiner

*Primary Examiner* — Lisa Lea Edmonds
*Assistant Examiner* — Christopher L Augustin
(74) *Attorney, Agent, or Firm* — Novak Druce Connolly Bove + Quigg LLP

(57) ABSTRACT

A blocking mechanism includes a chassis, a blocking member, and a resilient member. The chassis is configured to secure a circuit board, the chassis comprising a locking structure. The blocking member is configured to abut the circuit board, for preventing the circuit board from sliding towards the blocking member. The blocking member includes a positioning structure slidably engaged with the locking structure. The resilient member is secured to the blocking member and engaged with the locking structure for preventing the blocking member from sliding relative to the locking structure. The resilient member is resiliently deformable. When the resilient member is disengaged from the locking structure, the blocking member is slidable relative to the chassis to disengage the locking structure from the positioning structure.

14 Claims, 5 Drawing Sheets

ELECTRONIC DEVICE WITH BLOCKING MECHANISM

BACKGROUND

1. Technical Field

The present disclosure relates to electronic devices, more particularly to an electronic device with a blocking mechanism.

2. Description of Related Art

In a server system, a big and heavy motherboard is secured to a server chassis of the server system with screws. However, when the server chassis is struck, the screws may be damaged or the chassis may be damaged because of the big and heavy motherboard.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
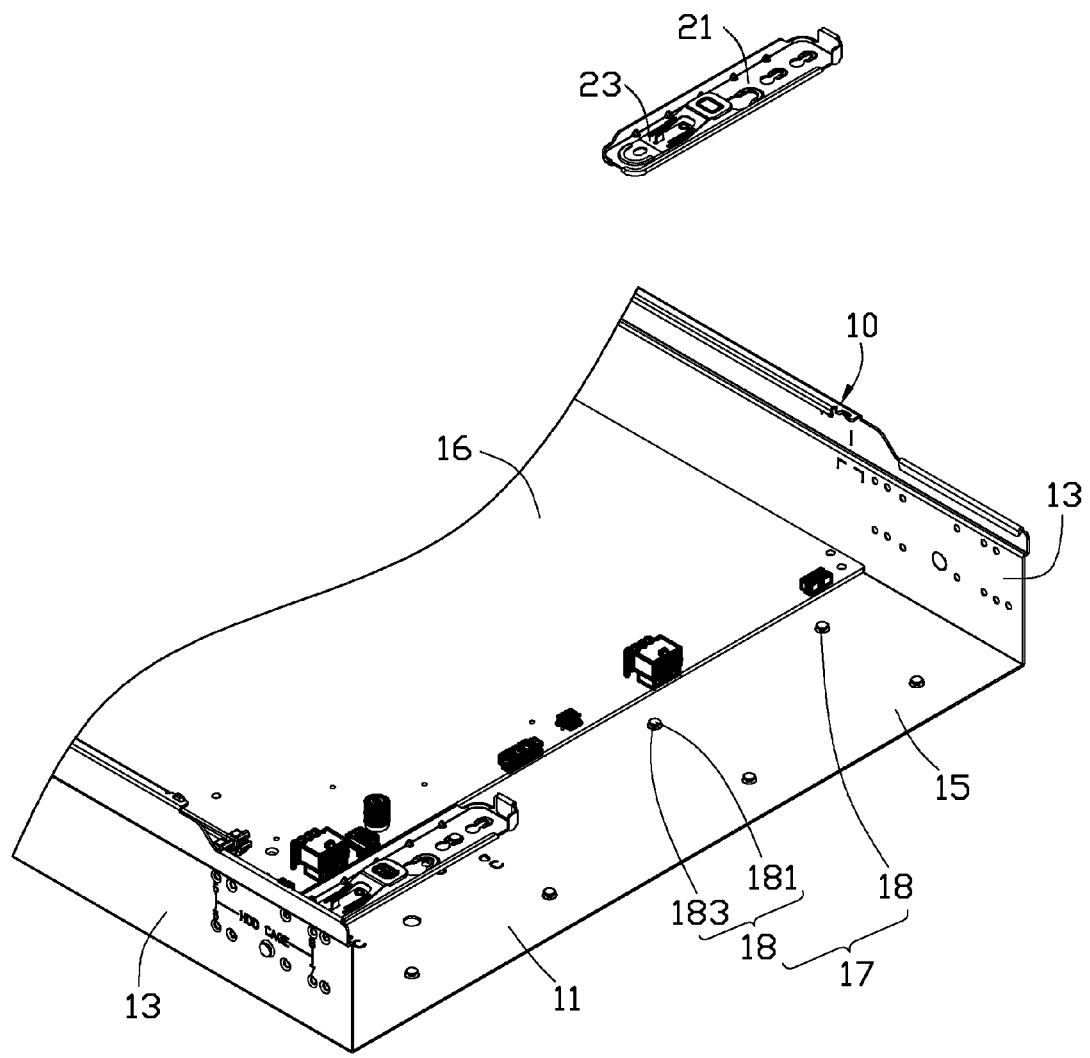
FIG. 1 is an exploded, isometric view of an electronic device in accordance with an embodiment.
Figure 2:
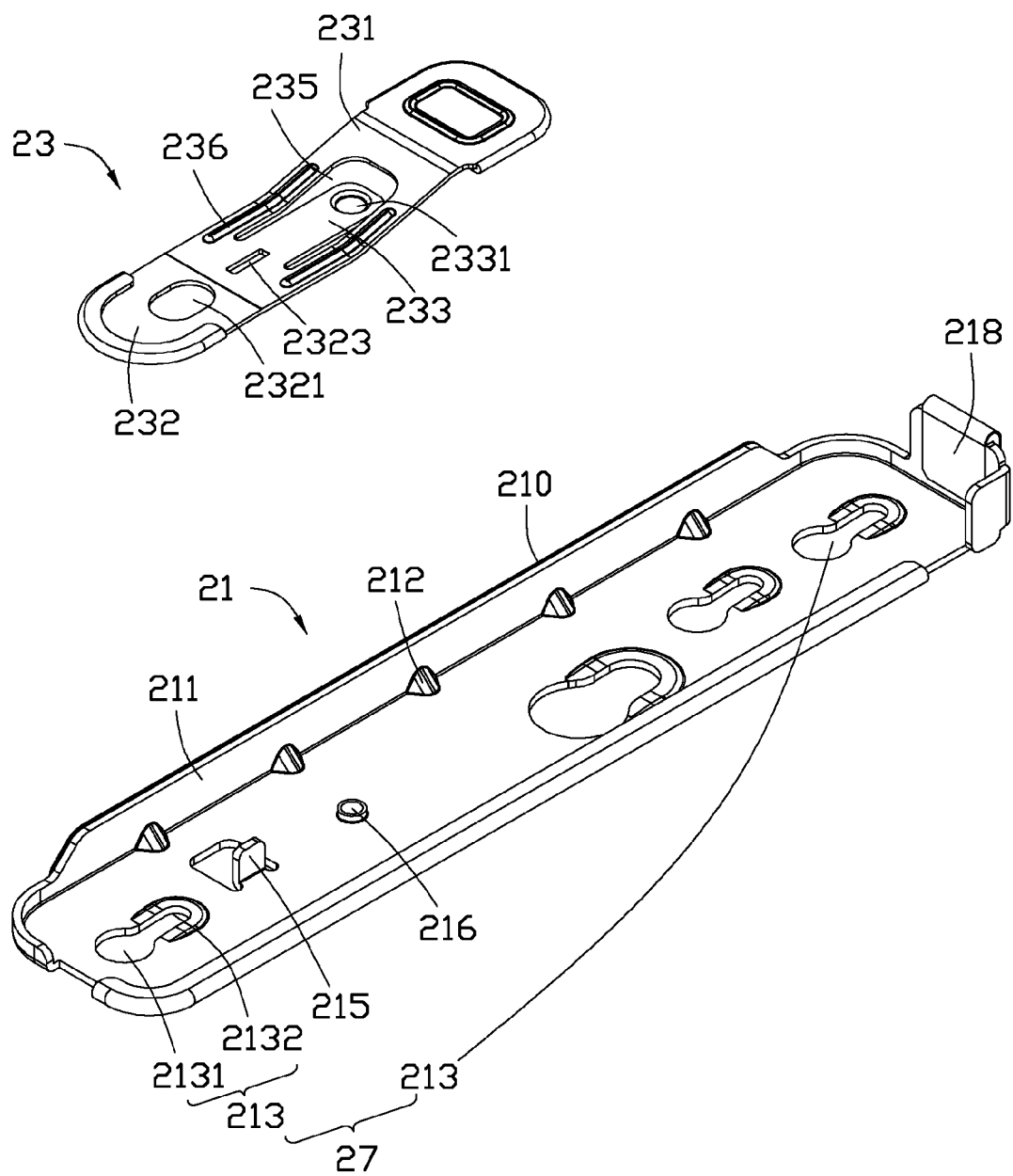
FIG. 2 is an exploded, isometric view of a resilient member and a blocking member of the electronic device of FIG. 1.
Figure 3:
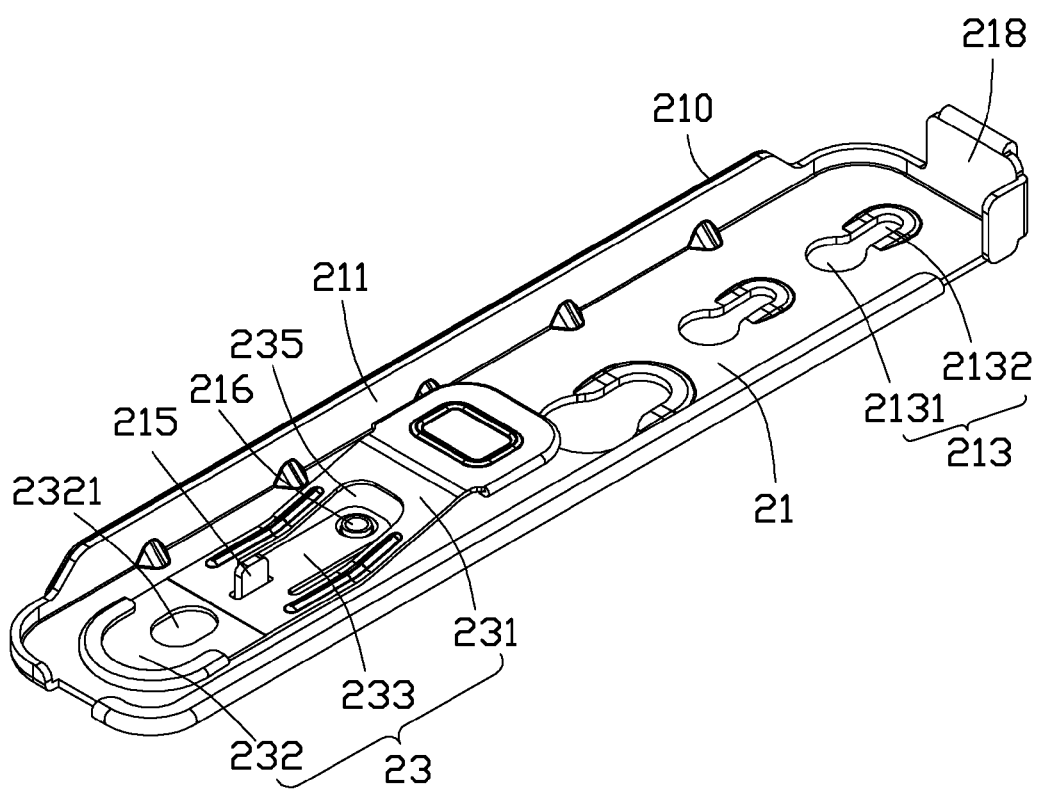
FIG. 3 is an assembled view of the resilient member and the blocking member of FIG. 2.

FIGS. 1-2 show a blocking mechanism in accordance with an embodiment. The blocking mechanism includes a chassis 10, a blocking member 21, and a resilient member 23.

Figure 5:
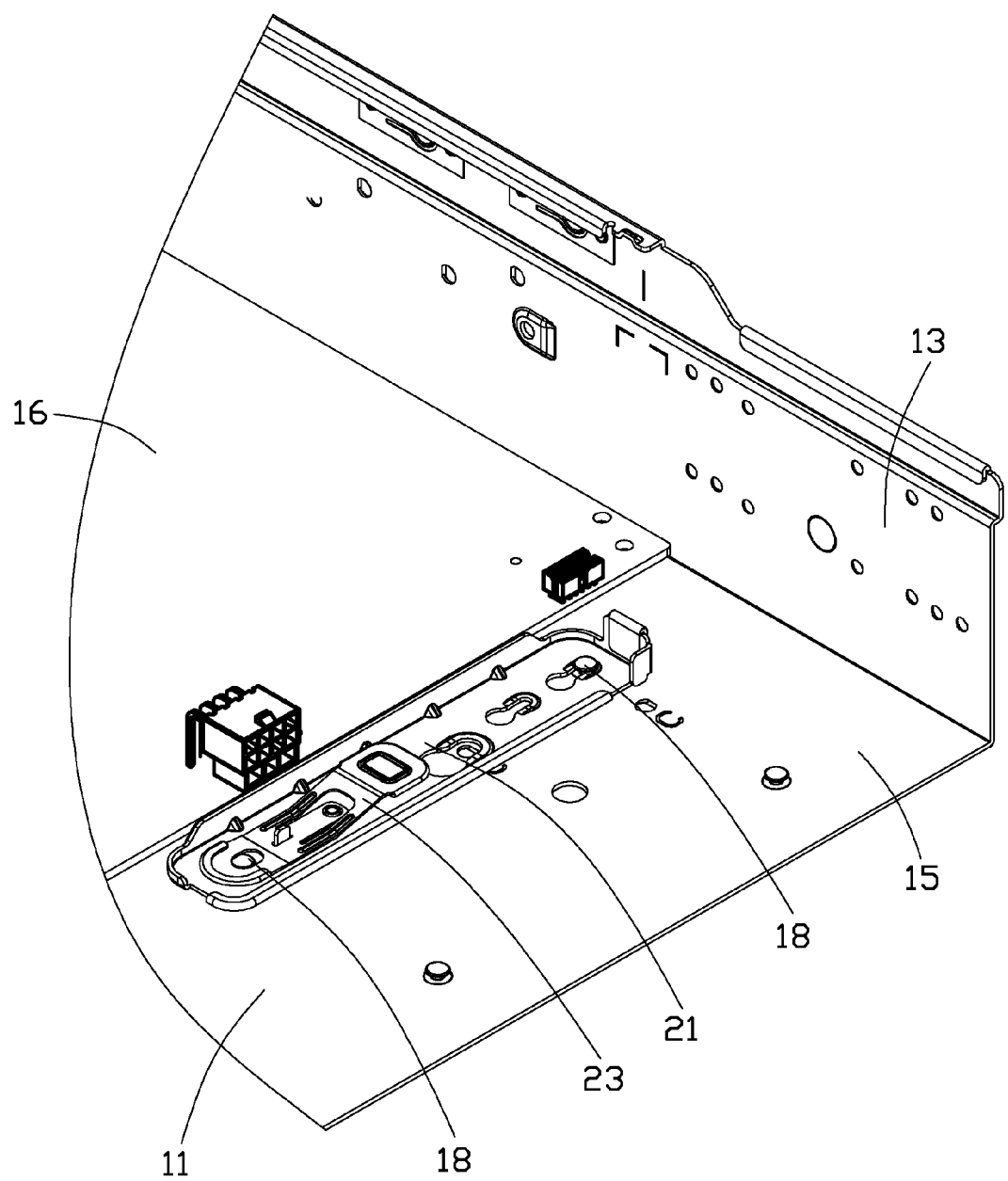
FIG. 5 is similar to FIG. 4, but shows the resilient member and the blocking member in unlocked position.

The chassis 10 secures a circuit board 16 and includes a locking structure 17. The blocking member 21 is configured to abut the circuit board 16, for preventing the circuit board 16 from sliding towards the blocking member 21. The blocking member 21 includes a positioning structure 27 configured to be slidably engaged with the locking structure 17. The resilient member 23 is configured to be secured to the blocking member 21 and to be engaged with the locking structure 17, for preventing the blocking member 21 from sliding relative to the locking structure 17. Referring to FIG. 5, when the resilient member 23 is resiliently deformed to disengage from the locking structure 17, the blocking member 21 is slidable relative to the chassis 10, and the locking structure 17 is disengaged from the positioning structure 27.

The resilient member 23 includes a mounting portion 232, a resilient piece 233, and a pressing portion 231. The resilient piece 233 and the pressing portion 231 extend from the mounting portion 232. The resilient piece 233 is configured to be secured to the blocking member 21. The pressing portion 231 is configured to resiliently deform the resilient piece 233 and move the mounting portion 232 away from the blocking member 21 to disengage the locking structure 17 from the positioning structure 27. In an embodiment, two elongated protrusions 236 protrude from the resilient member 23 and extend from the mounting portion 232 to the pressing portion 231, and the two elongated protrusions 236 are located on two opposite sides of the resilient piece 233.

The mounting portion 232 of the resilient member 23 defines a mounting hole 2321. The chassis 10 further includes a bottom plate 11 configured to support the circuit board 16. The locking structure 17 includes two locking posts 18 located on the bottom plate 11. One of the two locking posts 18 is engaged in the mounting hole 2321.

The positioning structure 27 includes two positioning holes 213 defined in the blocking member 21. Each of the two positioning holes 213 includes a wide part 2131 and a narrow part 2132 in communication with the wide part 2131. Each of the two locking posts 18 includes a head 181 and a neck 183 connected between the head 181 and the bottom plate 11 of the chassis 10. The neck 183 of each of the two locking posts 18 is configured to be slid in the narrow part 2132 of each of the two positioning holes 213 from the wide part 2131.

Figure 4:
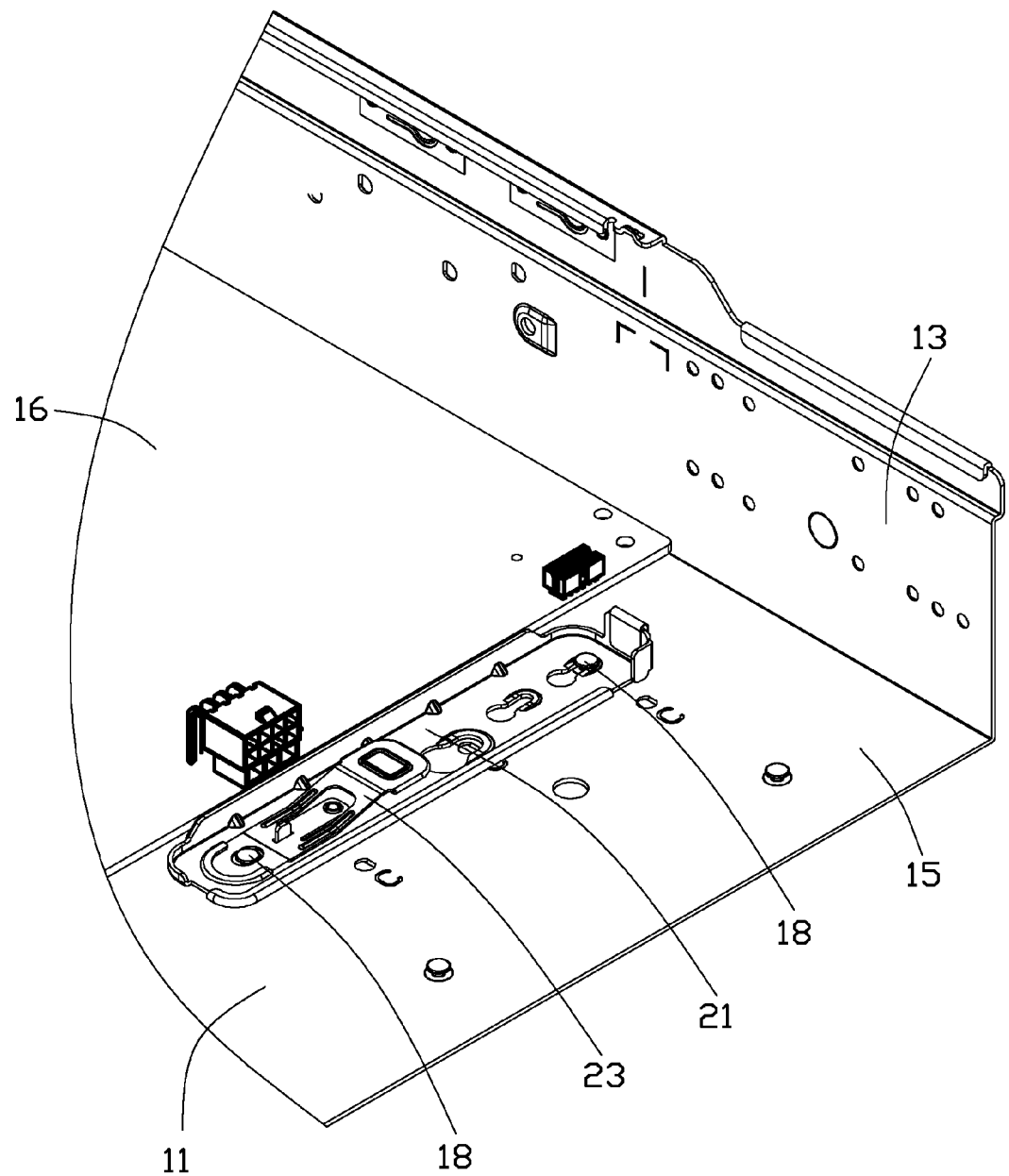
FIG. 4 is an assembled view of the electronic device of FIG. 1 and shows the resilient member and the blocking member in a locked position.

Referring to FIG. 4, the head 181 of each of the two locking posts 18 is inserted through the wide part 2131 of each of the two positioning holes 213 to resiliently deform the resilient piece 233 upwards. When the neck 183 of each of the two locking posts 18 is located in the narrow part 2132 of each of the two positioning holes 213, the head 181 of each of the two locking posts 18 blocks the blocking member 21 from moving away from the bottom plate 11 along a first direction perpendicular to the bottom plate 11, the resilient piece 233 returns to an original state, and the head 181 of one of the two locking posts 18 abuts the mounting portion 232 of the resilient member 23. The resilient member 23 and the blocking member 21 are located in a locked position. In an embodiment, the one of the two locking posts 18 abuts the mounting portion 232 of the resilient member 23 when the resilient member 23 and the blocking member 21 are located in the locked position.

The mounting portion 232 of the resilient member 23 defines a slit 2323. A limiting tab 215 is located on the blocking member 21, and the limiting tab 215 is configured to be received in the slit 2323. The resilient member 23 defines an opening 235, and the resilient piece 233 extends from an edge of the opening 235.

Referring to FIG. 5, when the resilient piece 233 is resiliently deformed to move the mounting portion 232 upwards by pressing the pressing portion 231 downwards, the mounting portion 232 is disengaged from the head 181 of one of the two locking posts 18. The blocking member 21 can be slid in a second direction perpendicular to the first direction, and the necks 183 can be slid from the narrow parts 2132 to the wide parts 2131. The resilient member 23 and the blocking member 21 are located in an unlocked position.

The blocking member 21 further includes an operating piece 218 and a flange 211. The operating piece 218 is configured to push the blocking member 21 to move. An insulation piece 210 is attached an outer surface of the flange 211, and the flange 211 is configured to abut the circuit board 16 via the insulation piece 210. The blocking member 21 further includes a plurality of ribs 212 to strengthen the flange 211.

The blocking member 21 further includes a fixing post 216, and the resilient piece 233 defines a fixing hole 2331. The fixing hole 2331 receives the fixing post 216, and the fixing post 216 can be secured to the blocking member 21 by rivet.

The chassis 10 further includes two side plates 13 substantially parallel to each other. The two side plates 13 are located on and substantially perpendicular to the bottom plate 11. The bottom plate 11 and the two side plates 13 cooperatively define a space 15 (shown in FIG. 1), which receives the circuit board 16. The second direction is substantially perpendicular to the two side plates 13. The circuit board 16 is substantially parallel to the bottom plate 11 and perpendicular to the two side plates 13. In an embodiment, the circuit board 16 is a motherboard.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A blocking mechanism comprising:
    a chassis configured to secure a circuit board, the chassis comprising a locking structure and a bottom plate configured to support the circuit board;
    wherein the locking structure comprises a locking post on the bottom plate;
    a blocking member configured to abut the circuit board for preventing the circuit board from sliding towards the blocking member, the blocking member comprising a positioning structure slidably engaged with the locking structure; and
    a resilient member secured to the blocking member and comprising a mounting portion, the resilient member being engaged with the locking structure for preventing the blocking member from sliding relative to the locking structure;
    wherein the mounting portion defines a mounting hole, and the locking post is engaged in the mounting hole and abuts the mounting portion; the resilient member is resiliently deformable; when the resilient member is disengaged from the locking structure, the blocking member is slidable relative to the chassis to disengage the locking structure from the positioning structure.

2. The blocking mechanism of claim 1, wherein the resilient member further comprises a resilient piece and a pressing portion, and the resilient piece and the pressing portion extend from the mounting portion; the resilient piece is secured to the blocking member; and the pressing portion is configured to resiliently deform the resilient piece and to move the mounting portion away from the blocking member to disengage the locking structure from the positioning structure.

3. The blocking mechanism of claim 1, wherein the positioning structure of the blocking member comprises a positioning hole; the positioning hole comprises a wide part and a narrow part communicating with the wide part; the locking post comprises a head configured to be inserted through the wide part and a neck connected between the bottom plate and the head; the neck is engaged in the narrow part; the head blocks the blocking member from moving away from the bottom plate and abuts the mounting portion of the resilient member.

4. The blocking mechanism of claim 3, wherein the mounting portion of the resilient member defines a slit; a limiting tab is formed on the blocking member; and the limiting tab is received in the slit.

5. The blocking mechanism of claim 2, wherein the resilient member defines an opening, and the resilient piece extends from an edge of the opening.

6. The blocking mechanism of claim 1, wherein the chassis comprises two parallel side plates substantially perpendicular to the bottom plate, and the blocking member is slidable in a direction substantially perpendicular to the two parallel side plates.

7. An electronic device comprising:
    a chassis comprising a locking structure and a bottom plate;
    a circuit board secured to the chassis; and the bottom plate supports the circuit board;
    wherein the locking structure comprises a locking post on the bottom plate;
    a blocking member abuts the circuit board and configured to prevent the circuit board from sliding towards the blocking member, the blocking member comprising a positioning structure slidably engaged with the locking structure; and
    a resilient member secured to the blocking member and comprising a mounting portion, the resilient member being engaged with the locking structure and configured to prevent the blocking member from sliding relative to the locking structure;
    wherein the mounting portion defines a mounting hole, and the locking post is engaged in the mounting hole and abuts the mounting portion; the resilient member is resiliently deformable; when the resilient member is disengaged from the locking structure, the blocking member is slidable relative to the chassis to disengage the locking structure from the positioning structure, and the blocking member is removable away from the circuit board.

8. The electronic device of claim 7, wherein the resilient member further comprises a resilient piece and a pressing portion, and the resilient piece and the pressing portion extend from the mounting portion; the resilient piece is secured to the blocking member; and the pressing portion is configured to resiliently deform the resilient piece and to move the mounting portion away from the blocking member to disengage the locking structure from the positioning structure.

9. The electronic device of claim 7, wherein the positioning structure of the blocking member comprises a positioning hole; the positioning hole comprises a wide part and a narrow part communicating with the wide part; the locking post comprises a head configured to be inserted through the wide part and a neck connected between the bottom plate and the head; the neck is engaged in the narrow part; the head blocks the blocking member from moving away from the bottom plate and abuts the mounting portion of the resilient member.

10. The electronic device of claim 9, wherein the mounting portion of the resilient member defines a slit; a limiting tab is formed on the blocking member; and the limiting tab is received in the slit.

11. The electronic device of claim 8, wherein the resilient member defines an opening, and the resilient piece extends from an edge of the opening.

12. The electronic device of claim 7, wherein the chassis comprises two parallel side plates substantially perpendicular to the bottom plate, and the blocking member is slidable in a direction substantially perpendicular to the two parallel side plates.

13. The electronic device of claim 12, wherein the circuit board is located on and substantially parallel to the bottom plate.

14. A blocking mechanism comprising:

a chassis configured to secure a circuit board, the chassis comprising a locking structure;

a blocking member configured to abut the circuit board for preventing the circuit board from sliding towards the blocking member, the blocking member comprising a positioning structure slidably engaged with the locking structure; and a resilient member secured to the blocking member and defining an opening, the resilient member being engaged with the locking structure for preventing the blocking member from sliding relative to the locking structure;

wherein the resilient member is resiliently deformable and comprises a mounting portion, a resilient piece and a pressing portion; and the resilient piece and the pressing portion extend from the mounting portion; the resilient piece extends from an edge of the opening; the pressing portion is configured to resiliently deform the resilient piece and move the mounting portion away from the blocking member; when the resilient member is disengaged from the locking structure, the blocking member is slidable relative to the chassis to disengage the locking structure from the positioning structure.

* * * * *